(12) United States Patent
Chao et al.

(10) Patent No.: US 7,285,912 B2
(45) Date of Patent: Oct. 23, 2007

(54) ORGANIC ELECTROLUMINESCENCE DEVICE HAVING TRANSPARENT CONTROL LAYER WITH LOW AMBIENT REFLECTION AND ENHANCED CONTRAST

(75) Inventors: Ching Ian Chao, Hsinchu (TW); Chia Kuo Yen, Hsinchu (TW); En-Chung Chang, Hsinchu (TW)

(73) Assignees: Industrial Technology Research Institute, Hsinchu (TW); WorldLED Co., Ltd, Taichung (TW)

( * ) Notice: Subject to any disclaimer, the term of this patent is extended or adjusted under 35 U.S.C. 154(b) by 0 days.

(21) Appl. No.: 10/919,307

(22) Filed: Aug. 17, 2004

(65) Prior Publication Data

US 2005/0231102 A1    Oct. 20, 2005

(30) Foreign Application Priority Data

Apr. 16, 2004    (TW) ............................... 93110692 A (51) Int. Cl.
*H01J 1/62* (2006.01)
(52) U.S. Cl. ...................................... 313/509; 313/506
(58) Field of Classification Search ................. 363/20, 363/21.01, 21.12, 21.13, 95, 97; 320/166; 313/498–509
See application file for complete search history.

(56) References Cited

U.S. PATENT DOCUMENTS

| | | | |
|---|---|---|---|
| 5,596,246 A | 1/1997 | Budzilek et al. | |
| 6,185,032 B1 | 2/2001 | Lee et al. | |
| 6,211,613 B1 | 4/2001 | May | |
| 6,362,984 B2 * | 3/2002 | Gekinozu | 363/97 |
| 6,396,718 B1 * | 5/2002 | Ng et al. | 363/21.07 |
| 6,411,019 B1 | 6/2002 | Hofstra | |
| 6,429,451 B1 | 8/2002 | Hung et al. | |
| 6,473,317 B1 * | 10/2002 | Simopoulos | 363/21.06 |
| 6,545,409 B2 | 4/2003 | Kahen | |
| 6,558,820 B2 | 5/2003 | Raychaudhuri et al. | |
| 6,590,789 B2 * | 7/2003 | Bailly | 363/21.12 |
| 6,608,333 B1 | 8/2003 | Lee et al. | |
| 6,835,953 B2 * | 12/2004 | Cok et al. | 257/59 |
| 2002/0043928 A1 | 4/2002 | Cho | |
| 2003/0067266 A1 * | 4/2003 | Kim et al. | 313/504 |
| 2003/0071567 A1 * | 4/2003 | Eida et al. | 313/504 |
| 2004/0183433 A1 * | 9/2004 | Cho et al. | 313/504 |
| 2005/0110716 A1 * | 5/2005 | Eida et al. | 345/76 |

* cited by examiner

*Primary Examiner*—Joseph Williams
*Assistant Examiner*—Bumsuk Won
(74) *Attorney, Agent, or Firm*—Birch, Stewart, Kolasch & Birch, LLP (57) ABSTRACT

An organic electroluminescence device with a low reflectivity includes organic electroluminescence layers, a transparent electrode, a thin metal electrode, a control layer, and an auxiliary electrode. The transparent electrode and the thin metal electrode are sited on both sides of the OEL layer, respectively, in order to excite it to emit light. The auxiliary electrode and the thin metal electrode are mostly separated by a control layer. Both the auxiliary electrode and the thin metal electrode are locally connected to maintain electrically connected. Therefore, the control layer is not necessarily conductive and its material selection is not restricted by the requirement of work function matching with adjacent layers. The disclosed OLED device with a low reflectivity does not require a circular polarizer. It can be used for both active-matrix and passive-matrix OLED displays. The reflection of ambient light can be largely reduced to increase the contrast of the display panel.

14 Claims, 6 Drawing Sheets

ORGANIC ELECTROLUMINESCENCE DEVICE HAVING TRANSPARENT CONTROL LAYER WITH LOW AMBIENT REFLECTION AND ENHANCED CONTRAST

This Non-provisional application claims priority under 35 U.S.C. § 119(a) on Patent Application No(s). 093110692 filed in Taiwan, Republic of China on Apr. 16, 2004, the entire contents of which are hereby incorporated by reference.

BACKGROUND OF THE INVENTION

1. Field of Invention

The invention relates to an organic electroluminescence device and, in particular, to an organic electroluminescence device with a low reflectivity.

2. Related Art

The organic electroluminescence device which is also named organic light-emitting diode (OLED) has the advantages of both LCD and inorganic LED, such as thin, lightweight, high-resolution, power-saving, self-emission and high-response, etc. However, the conventional OLED needs to be deposited a metallic electrode, the contrast of OLED panel will greatly reduce due to the reflection of the ambient light. The legibility for a conventional OLED panel is thus relatively poor.

A conventional method so far is to attach a layer of circular polarizer (CP) on an OLED by changing the phase of the incident ambient light to reduce the reflection. As described in the U.S. Pat. Nos. 5,596,246 and 6,211,613, the CP is attached on the display. This method has been adopted in mass production for OLED. However, the use of CP will increase the production cost. One may also use optical absorption and optical interference to reduce the reflectivity of the metallic electrode. The U.S. Pat. Nos. 6,185,032, 6,558,820, 6,545,409, and the early disclosure No. 2002/0043928 proposed another method, which coats a thin layer of dark-colored or black light-absorbing material before the reflective metallic electrode of the OLED. This method reduces the reflectivity of the metallic electrode and increases the panel contrast. Moreover, one can also use the method of using optical absorption along with the destructive interference to reduce the device reflectivity, as disclosed in the U.S. Pat. Nos. 6,411,019, 6,545,409, 6,429,451, and 6,608,333. The device structure disclosed in the U.S. Pat. No. 6,411,019 is to insert an interference layer in the OLED. The interference layer is between the electrode and organic electroluminescence (OEL) layer of the device to reduce the reflectivity due to optical absorption and destructive interference. To excite the OEL layer between the anode and the cathode, the inserted interference layer has to be made of a conductive material. The work function difference between the interference layer and the electrode has to be extremely small in order not to reduce the carrier injection and increase the device operation voltage. This reduces the selection of the interference layer materials. In order to satisfy both the conductivity and the work function requirements, one usually selects indium tin oxide (ITO), indium zinc oxide (IZO), or a mixture of aluminum and silicon oxide as the interference layer. The device structure disclosed in the U.S. Pat. No. 6,545,409 is to use the thin cathode/light-absorbing layer/dielectric layer/metal layer structure in the OLED and the cathode and the metal layer are electrically connected. By controlling the conditions of the light-absorbing layer, the dielectric layer and the thin cathode, the reflectivity is also reduced due to the optical absorption and destructive interference. However, it is necessary to use the light-absorbing layer with an absorption coefficient greater than $10^4$ cm$^{-1}$ and the dielectric layer. Thus, it is limited for choosing materials, and it is also a little complicated in manufacturing and condition controls.

SUMMARY OF THE INVENTION

In view of the foregoing, the invention provides an organic electroluminescence (OEL) device to remove its reflection of the ambient light by inserting a transparent control layer with an appropriate thickness, thereby enhancing the contrast of the OEL device and panel. Through the device structure design, the control layer is not necessarily to be conductive and there is no need to adjust the work function of each adjacent layer. This enlarges the selection space of the control layer materials.

To achieve the above objective, the disclosed OLED device includes a transparent electrode, organic electroluminescence (OEL) layers, a thin metal layer, a transparent control layer, and an auxiliary electrode. The transparent electrode and the thin metal electrode are sited on both sides of the OEL layers in order to excite it to emit light. The control layer is transparent and adjacent to the thin metal electrode. The auxiliary electrode and the thin metal electrode are used to sandwich the control layer. Most of the region between the thin metal electrode and the auxiliary electrode is inserted with the transparent control layer with an appropriate thickness. However, the auxiliary electrode and the thin metal electrode are electrically connected at the other part of the sandwiched region without the control layer. By way of optical absorption and destructive interference, the invention can largely reduce the reflection caused by the ambient light, thus enhancing the contrast of the OLED display.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

The invention can be applied to bottom-emission and top-emission organic electroluminescence (OEL) devices; only the coating order and device structures need to be modified.

Figure 1:
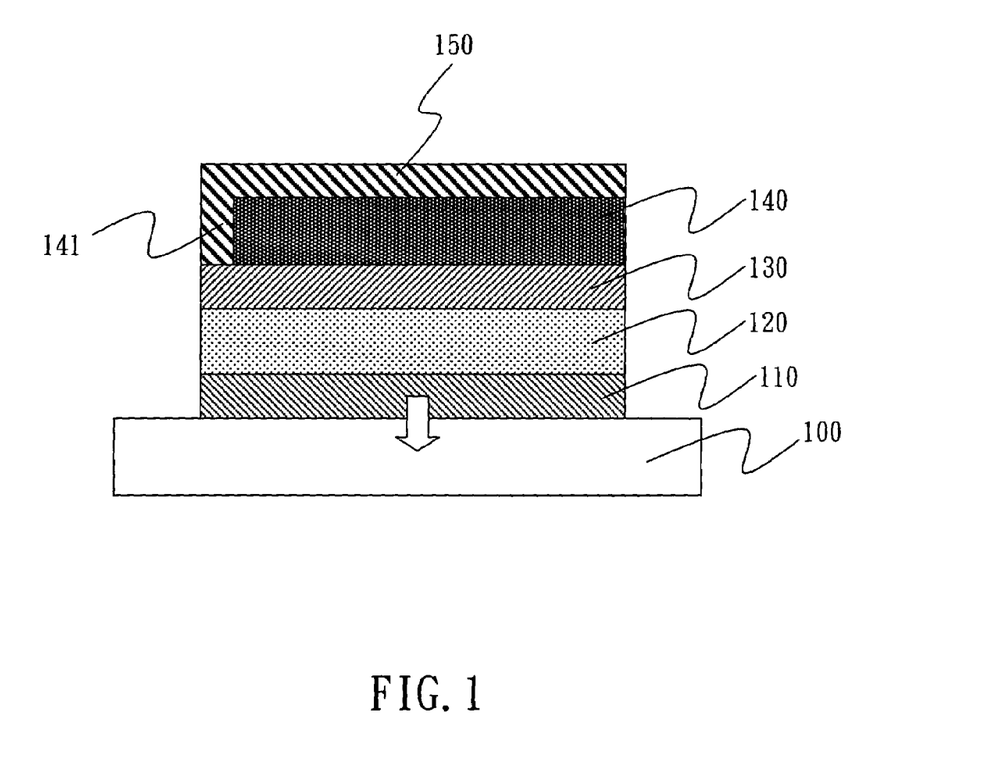
FIG. 1 is a schematic view of the structure in the first embodiment of the invention.

The first embodiment shown in FIG. 1 belongs to the bottom-emission OLED device. The OLED device includes a transparent electrode 110, OEL layers 120, a thin metal layer 130, a control layer 140, and an auxiliary electrode 150 made of a metallic material. The transparent electrode 110 is formed on the surface of a transparent substrate 100. The OEL layers 120 are coated on the transparent electrode. The thin metal electrode 130 is formed on the OEL layers 120. The thin metal electrode 130 is further formed with the control layer 140 and the auxiliary electrode 150 so that the control layer 140 is sandwiched between the thin metal electrode 130 and the auxiliary electrode 150. The auxiliary electrode 150 and the thin metal electrode 130 are electrically connected via a conductive region 141.

Figure 2:
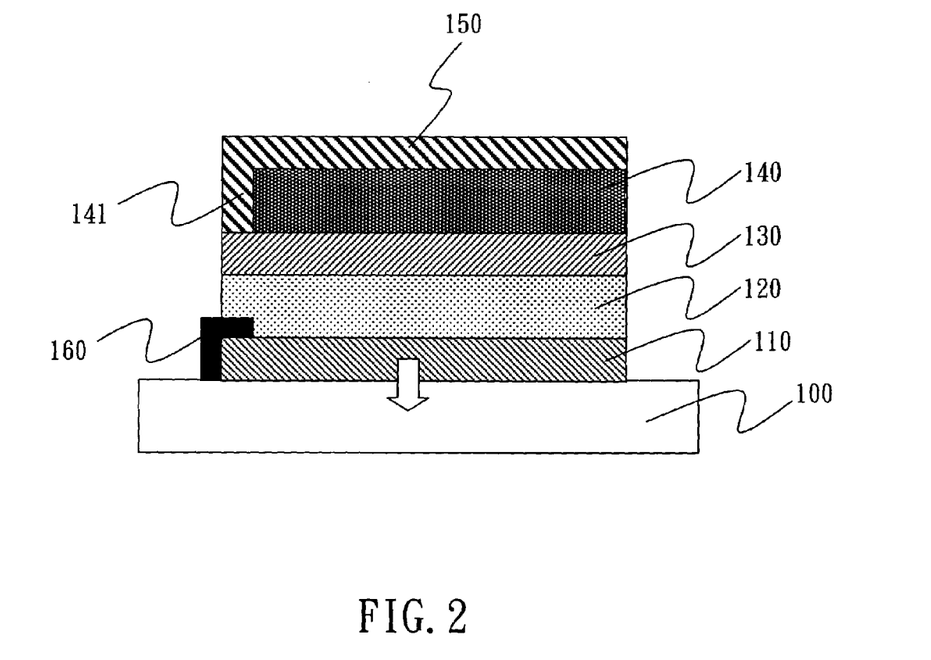
FIG. 2 is a schematic view of the structure in the second embodiment of the invention.

Since the conductive region 141 connecting the thin metal electrode 130 and the auxiliary electrode 150 does not contain the control layer, its reflectivity is higher. To reduce its local reflection, a black matrix 160 is installed on the region of the transparent electrode 110 corresponding to the conductive region, as shown in the second embodiment in FIG. 2. The surface of the transparent substrate 100 is formed in sequence with a transparent electrode 110, a black matrix 160, OEL layers 120, a thin metal electrode 130, a control layer 140, and an auxiliary electrode 150. The black matrix 160 is coated on a part of the transparent electrode 110. The OEL layers 120 are coated on both the transparent electrode 110 and the black matrix 160. The thin metal electrode 130 is formed on the OEL layers 120. The thin metal electrode 130 is further formed with the control layer 140 and the auxiliary electrode 150 so that the control layer 140 is sandwiched between the thin metal electrode 130 and the auxiliary electrode 150. The auxiliary electrode 150 and the metal electrode 130 are electrically connected via a conductive region 141, and the high reflection of the conductive region 141 will be reduced due to the black matrix 160.

Figure 3:
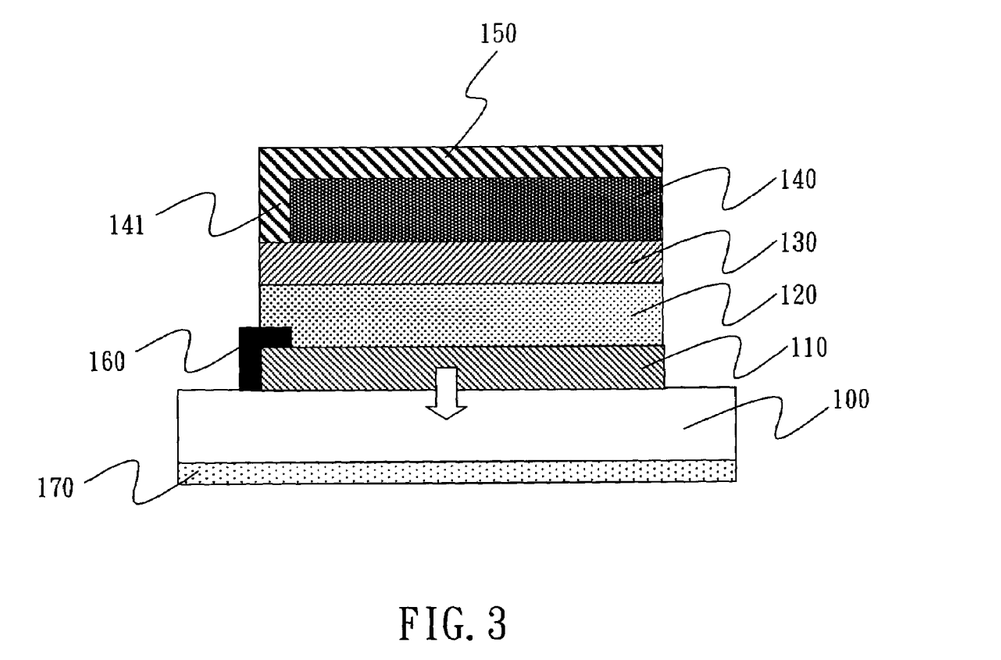
FIG. 3 is a schematic view of the structure in the third embodiment of the invention.

Reflections also occur at the interface between the substrate of the OLED device and the air, thus increasing the reflectivity. In order to reduce the overall reflectivity, an anti-reflection coating (ARC) is formed on the other surface of the substrate. As shown in FIG. 3, one surface of the transparent substrate 100 is formed in sequence with a transparent electrode 110, a black matrix 160, OEL layers 120, a thin metal layer 130, a control layer 140, and an auxiliary electrode 150. The black matrix 160 is coated on a part of the transparent electrode 110. The OEL layers 120 are coated on both the transparent electrode 110 and the black matrix 160. The thin metal electrode 130 is formed on the OEL layers 120. The thin metal electrode 130 is further formed with the control layer 140 and the auxiliary electrode 150 so that the control layer 140 is sandwiched between the thin metal electrode 130 and the auxiliary electrode 150. The auxiliary electrode 150 and the thin metal electrode 130 are electrically connected via a conductive region 141, and the high reflection of the conductive region 141 will be reduced due to the black matrix 160. In addition, the other surface of the transparent substrate 100 is coated with an ARC 170 to further reduce the reflection between the substrate and the air.

Figure 4:
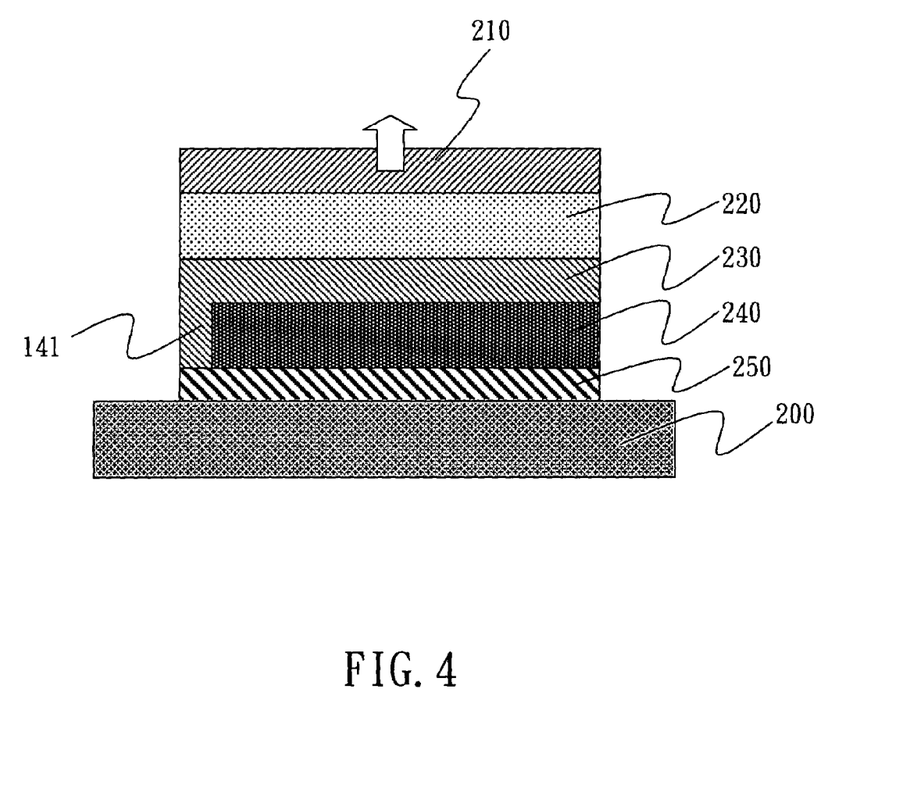
FIG. 4 is a schematic view of the structure in the fourth embodiment of the invention.

Please refer to FIG. 4 for a top-emission OLED device, which is the fourth embodiment of the invention. The OLED device includes a transparent electrode 210, OEL layers 220, a thin metal layer 230, a control layer 240, and an auxiliary electrode 250. The auxiliary electrode 250 is formed on the surface of a substrate 200. The control layer 240 is formed on the auxiliary electrode 250 made of a metallic material. The thin metal electrode 230 is formed on the control layer 240. The control layer 240 is sandwiched between the thin metal electrode 230 and the auxiliary electrode 250. The auxiliary electrode 250 and the thin metal electrode 230 are electrically connected via a conductive region 241. The OEL layers 220 are coated on the thin metal electrode 230. The transparent electrode 210 is formed on the OEL layers 220. The top-emission OLED device uses the side with the transparent electrode 210 as the display surface.

Following the same principle, the top-emission OLED device can be formed with an ARC on its display surface to reduce reflections at the interface between the display surface and the air. One can also insert a black matrix formed in a region corresponding to the conductive region to reduce the local high reflection in the conductive region joining the thin metal electrode and the auxiliary electrode.

In the embodiments of the invention, the material of the transparent electrode is selected from transparent conductive substances such as indium tin oxide (ITO) and indium zinc oxide (IZO) or thin metal layer. The thin metal electrode is semi-transparent. Its material is selected from metals, alloys, or metal oxides. Its thickness is below 20 nanometers (nm). The control layer is a transparent material selected from inorganic insulating substances, inorganic semiconductor substances, organic insulating substances, organic semiconductor substances, or their combinations. Its thickness is above 30 nm and less than 300 nm. The transparent material has an average absorption coefficient between 400 nm and 700 nm less than $10^4$ cm$^{-1}$. The OEL layers can be a combination with different numbers of hole injection layer, hole transport layer, emission layer, electron transport layer, electron injection layer, and carrier generation layer.

To prove that the disclosed device can reduce reflections caused by the ambient light, we use the first embodiment structure with control layers made of different materials to test. The control layer materials are, respectively, LiF, NPB, and rubrene. The thickness can be adjusted according to the optical property of the material to achieve a lower reflection.

First Test Embodiment

A glass substrate with a transparent electrode is first precleaned by ultrasonic treatment in detergent, pure water and iso-propanol in sequence, followed by drying in an oven. Afterwards, the glass substrate is placed on a substrate holder in a cluster-type vacuum chamber. The surface of the transparent electrode is first processed by oxygen plasma. Afterwards, the transparent electrode is coated with 5 nm AlF$_3$ as the hole injection layer, 60 nm NPB as the hole transport layer, and 60 nm Alq$_3$ as the emission layer and the electron transport layer, thereby forming the OEL layers. It is further coated with 0.5 nm LiF and X1 nm aluminum as the thin metal electrode. The thin metal electrode is then coated with Y1 nm LiF as the control layer. Finally, 100 nm aluminum is coated as the auxiliary electrode. The conductive region between the thin metal electrode and the auxiliary electrode can be adjusted and controlled by tuning the angle of the metal mask and the evaporation angle. After packaging the OLED device, we measure the average reflectivity (400~700 nm) of the OLED device. The test results of devices using X1 and Y1 are given in Table 1.

TABLE 1

| Al = X1 nm | LiF = Y1 nm | Average reflectivity (%) |
|---|---|---|
| 8 | 72 | 14.6 |
| 7.2 | 72 | 10.2 |
| 6.4 | 72 | 6.6 |
| 6.4 | 64 | 7.4 |
| 6.4 | 80 | 5.9 |
| 0 | 0 | 63.4 |

Figure 5:
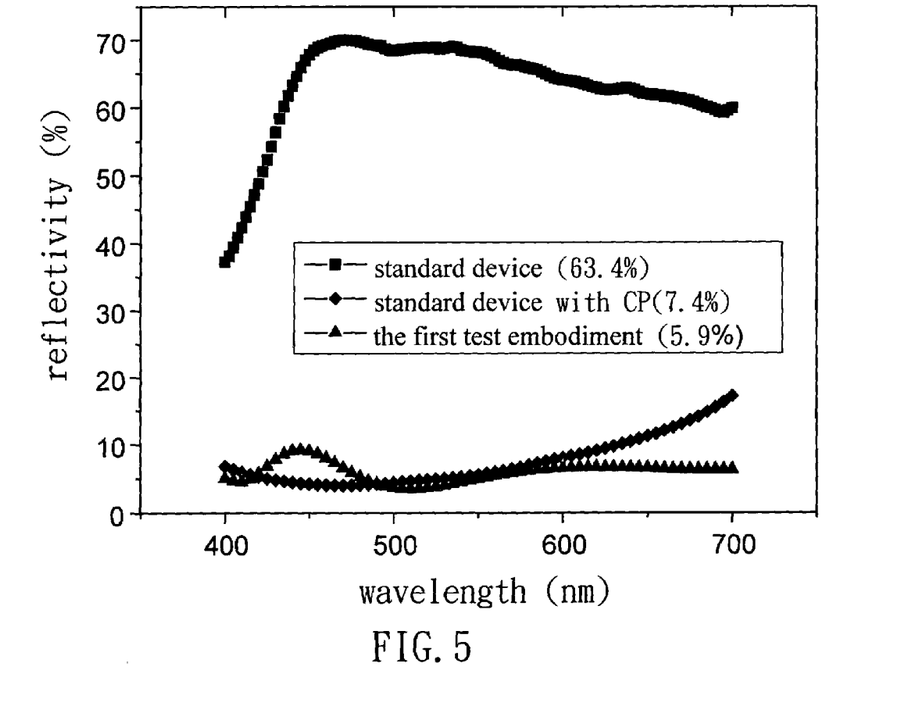
FIG. 5 shows the comparative reflectivity spectra of a standard device and the first test embodiment.

From the above results, the average reflectivity of the standard device without both a thin metal electrode and a control layer (X1=0, Y1=0) is 63.4%. After taping a circular polarizer (CP) on the standard device, we obtain an average reflectivity of 7.4%. The device in the first test embodiment has a reflectivity far lower than the standard device. The device in the first test embodiment (X1=6.4, Y1=80) has an average reflectivity of 5.9% only, even lower than the standard device attached with CP. The reflection spectra of these three devices are shown in FIG. 5.

Moreover, the emission efficiency of the standard device will reduce to be 45% of its original efficiency after taping the CP. However, the device with a control layer can still maintain the emission efficiency above 50% of the standard device. The turn-on voltages of the device with a control layer and the standard device are both at 2.6 V. The voltage-current properties of both devices are very similar.

Second Test Embodiment

The control conditions of the manufacturing process and materials here are the same as in the first test embodiment. We only change the material of the control layer to NPB and set its thickness to be Y2. At the same time, the aluminum thickness of the thin metal electrode is X2. The test results for devices with different X2 and Y2 are given in Table 2. It clearly shows that the device in the second test embodiment has a reflectivity far lower than the standard device.

TABLE 2

| Al = X2 nm | NPB = Y2 nm | Average reflectivity (%) |
|---|---|---|
| 12.5 | 150 | 33.8 |
| 12.5 | 130 | 26.7 |
| 12.5 | 110 | 17.6 |
| 12.5 | 90 | 16.3 |
| 10 | 90 | 13.6 |
| 7.5 | 90 | 19.6 |

Third Test Embodiment

The control conditions of the manufacturing process and materials here are almost the same as in the first test embodiments. We only change the material of the control layer to rubrene and set its thickness to be Y3. At the same time, the aluminum thickness of the thin metal electrode is X3. The test results for devices with different X3 and Y3 are given in Table 3. It clearly shows that the device in the third test embodiment has a reflectivity far lower than the standard device.

TABLE 3

| Al = X3 nm | Rubrene = Y3 nm | Average reflectivity (%) |
|---|---|---|
| 10 | 100 | 18.7 |
| 10 | 85 | 10.7 |
| 10 | 70 | 9.1 |
| 8 | 90 | 8.9 |
| 8 | 80 | 9.5 |
| 8 | 70 | 11.1 |

Figure 6:
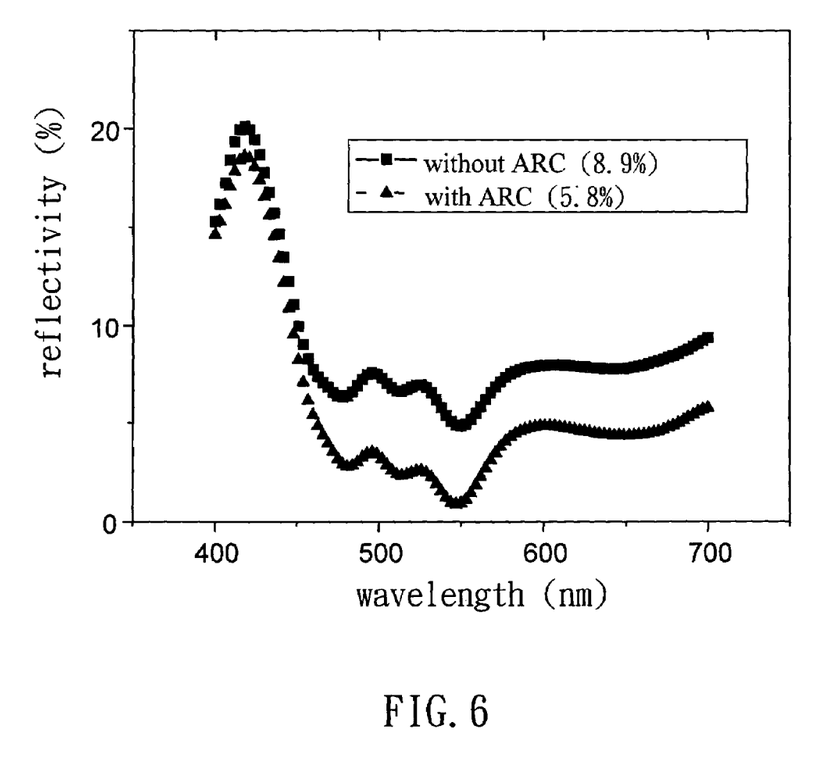
FIG. 6 shows the comparative reflectivity spectra of the third test embodiment with ARC.

To further reduce the reflectivity, the device in the third test embodiment (X3=8, Y3=90) is coated with an ARC or taped with another piece of transparent substrate with an ARC on the other surface of the OLED device substrate to prevent reflections at the substrate-air interface. The average reflectivity of the OLED device can reduce from 8.9% to 5.8%. The reflection spectra of these two devices are shown in FIG. 6.

From the test results of the first to third test embodiments, we learn that by tuning the thin metal electrode and the control layer and by coating an ARC, the reflectivity of the OLED device can be effective reduced. One may also adjust the ingredients of the auxiliary electrode (e.g. other metals or alloys) to achieve better effects.

In the above-mentioned test embodiments, the local junction between the thin metal electrode and the auxiliary electrode can be made using a metal mask with different coating angles. However, one can also employ other manufacturing processes such as shadow masks, ribs, collimators, dry etching, and laser processing.

Certain variations would be apparent to those skilled in the art, which variations are considered within the spirit and scope of the claimed invention.

What is claimed is:

1. An organic electroluminescence device having transparent control layer with low ambient reflection and enhanced contrast, comprising:
    a plurality of organic electroluminescence layers;
    a transparent electrode and a thin metal electrode, sited on both sides of the organic electroluminescence layers, respectively, to excite the organic electroluminescence layer to emit light, wherein the thin metal electrode is semi-transparent;
    a control layer with a thickness less than 300 nm, which is adjacent to the thin metal electrode, for reducing the reflection of an ambient light from the thin metal electrode; and
    a metallic material auxiliary electrode, which is adjacent to the control layer;
    wherein most region of the control layer is sandwiched between the auxiliary electrode and the thin metal electrode, the auxiliary electrode and the thin metal electrode are electrically connected through a conductive region.

2. The organic electroluminescence device of claim 1, wherein the organic electroluminescence layers contain a combination of a hole injection layer, a hole transport layer, an emission layer, an electron transport layer, an electron injection layer, and a carrier generation layer.

3. The organic electroluminescence device of claim 1, wherein the transparent electrode is made of a material selected from the group consisting of indium tin oxide (ITO), indium zinc oxide (IZO), and thin metal layers.

4. The organic electroluminescence device of claim 1, wherein the thin metal electrode is made of a material selected from the group consisting of metals, alloys, and metal oxides.

5. The organic electroluminescence device of claim 1, wherein a thickness of the thin metal electrode is below 20 nm.

6. The organic electroluminescence device of claim 1, wherein the control layer is made of a transparent material having an average absorption coefficient between 400 nm and 700 nm less than $10^4$ cm$^{-1}$.

7. The organic electroluminescence device of claim 1, wherein the control layer is made of a material selected from the group consisting of inorganic insulating materials, inorganic semiconductor materials, organic insulating materials, organic semiconductor materials, and their combinations.

8. The organic electroluminescence device of claim 1, wherein the auxiliary electrode is made of a material selected from the group consisting of metals and alloys.

9. The organic electroluminescence device of claim 1, wherein a thickness of the auxiliary electrode is above 30 nm.

10. The organic electroluminescence device of claim 1 further comprising a transparent substrate whose upper surface is formed in sequence the transparent electrode, the organic electroluminescence layers, the thin metal electrode, the control layer, and the auxiliary electrode.

11. The organic electroluminescence device of claim 10, wherein a lower surface of the transparent substrate is coated with an anti-reflection coating (ARC).

12. The organic electroluminescence device of claim 10, wherein a lower surface of the transparent substrate is attached with another transparent substrate coated with an ARC.

13. The organic electroluminescence device of claim 1 further comprising a substrate whose one surface is formed in sequence the auxiliary electrode, the control layer, the thin metal electrode, the organic electroluminescence layer, and the transparent electrode.

14. The organic electroluminescence device of claim 1 further comprising a black matrix formed in a region corresponding to the conductive region.

* * * * *